United States Patent
Wu et al.

(10) Patent No.: US 10,215,937 B1
(45) Date of Patent: Feb. 26, 2019

(54) OPTOELECTRONIC PACKAGE

(71) Applicant: UNISTARS CORPORATION, Zhudong Township (TW)

(72) Inventors: Shang-Yi Wu, Hsinchu (TW); Hsin-Hsien Hsieh, Taoyuan (TW)

(73) Assignee: UNISTARS CORPORATION, Hsinchu (TW)

( * ) Notice: Subject to any disclaimer, the term of this patent is extended or adjusted under 35 U.S.C. 154(b) by 12 days.

(21) Appl. No.: 15/967,467

(22) Filed: Apr. 30, 2018

(30) Foreign Application Priority Data

Mar. 16, 2018 (TW) .............................. 107109056 A

(51) Int. Cl.
- *G02B 6/42* (2006.01)
- *H01L 33/52* (2010.01)
- *H01L 23/00* (2006.01)
- *H01L 33/48* (2010.01)

(52) U.S. Cl.
CPC ......... *G02B 6/4214* (2013.01); *G02B 6/4245* (2013.01); *H01L 24/42* (2013.01); *H01L 33/486* (2013.01); *H01L 33/52* (2013.01); *H01L 2224/16225* (2013.01); *H01L 2224/48091* (2013.01); *H01L 2224/48464* (2013.01)

(58) Field of Classification Search
CPC ..... G02B 6/4214; G02B 6/4245; H01L 24/42; H01L 33/52; H01L 33/486; H01L 2224/16225; H01L 2224/48091; H01L 2224/48464

USPC ........................................................... 385/14
See application file for complete search history.

(56) References Cited

U.S. PATENT DOCUMENTS

| | | | | |
|---|---|---|---|---|
| 2010/0230711 | A1* | 9/2010 | Kuo ................... | H01L 33/0079 257/99 |
| 2012/0211774 | A1* | 8/2012 | Harada ................... | H01L 33/56 257/88 |
| 2015/0166847 | A1* | 6/2015 | Morita ................... | H01L 33/46 257/98 |
| 2016/0276543 | A1* | 9/2016 | Hung ................... | H01L 27/0248 |
| 2017/0068038 | A1* | 3/2017 | Danesh ................ | G02B 6/0003 |

* cited by examiner

*Primary Examiner* — Jerry M Blevins
(74) *Attorney, Agent, or Firm* — Ding Yu Tan

(57) ABSTRACT

An optoelectronic package includes a wiring substrate having a holding plane, an optoelectronic chip, a reflective material, an optical element and an adhesive. The optoelectronic chip is mounted on the holding plane and electrically connected to the wiring substrate. The optoelectronic chip has an upper surface, a functional region and a side surface connected to the upper surface. The reflective material is on the holding plane and surrounds the optoelectronic chip. The reflective material covers the side surface and has an inclined surface. The inclined surface surrounds the upper surface and extends from an edge of the upper surface. The height of the reflective material at the inclined surface decreases from the optoelectronic chip toward a direction away from the optoelectronic chip. The adhesive covers the reflective material and the upper surface and is connected between the optoelectronic chip and the optical element.

10 Claims, 2 Drawing Sheets

OPTOELECTRONIC PACKAGE

FIELD OF THE INVENTION

The present invention relates to an optoelectronic package, and more particularly to an optoelectronic package with a reflective material.

BACKGROUND OF THE INVENTION

At present, the interior of a lot of lighting emitting diode (LED) packages is designed to have a cavity for mounting a die, where the cavity is formed by a wiring substrate, a frame-shaped molding compound and a secondary optical element. The molding compound surrounds the die and is located between the secondary optical element and the wiring substrate. The molding compound does not touch the die, that is, there is a space between the molding compound and the die. The secondary optical element covers and adheres to the molding compound. The above-mentioned space will form a frame-shaped overlapping region between the molding compound and the secondary optical element, where the size of the overlapping region is limited. Therefore, the adhesion strength between the molding compound and the secondary optical element may be weak, resulting in a poor reliability.

SUMMARY OF THE INVENTION

The present invention provides an optoelectronic package with a better reliability.

The optoelectronic package provided by the present invention includes a wiring substrate, an optoelectronic chip, a reflective material, an optical element and an adhesive. The wiring substrate has a holding plane. The optoelectronic chip is mounted on the holding plane and electrically connected to the wiring substrate. The optoelectronic chip has an upper surface, a functional region formed in the upper surface, and a side surface connected to the upper surface. The reflective material is disposed on the holding plane and surrounds the optoelectronic chip. The reflective material covers the side surface of the optoelectronic chip and has an inclined surface. The inclined surface surrounds the upper surface of the optoelectronic chip and extends from an edge of the upper surface. A height of the reflective material at the inclined surface decreases from the optoelectronic chip toward a direction away from the optoelectronic chip. The adhesive binding the optoelectronic chip with the optical element covers the reflective material and the upper surface of the optoelectronic chip.

In an embodiment, the optoelectronic chip is a light emitting chip or a light sensing chip.

In an embodiment, the wiring substrate includes a metal pattern layer on the holding plane, and the optoelectronic chip is electrically connected to the metal pattern layer.

In an embodiment, the metal pattern layer includes a mounting layer. Both the optoelectronic chip and the reflective material are disposed on the mounting layer. The mounting layer protrudes from the side surface of the optoelectronic chip. The reflective material extends along the mounting layer.

In an embodiment, the reflective material includes a polysiloxane and a plurality of reflective particles.

In an embodiment, the adhesive includes a plurality of scattering particles.

In an embodiment, the optoelectronic package further includes at least one bonding wire electrically connecting the optoelectronic chip and the wiring substrate.

In an embodiment, the reflective material and the adhesive wrap over or encapsulate at least one bonding wire.

In an embodiment, the optoelectronic chip is mounted on the holding plane in a flip-chip manner.

In an embodiment, the reflective material further has a flat surface extending from the inclined surface and surrounding the inclined surface.

Based on the above, the reflective material covers the side surface of the optoelectronic chip, and the adhesive connecting the optoelectronic chip and the optical element covers the reflective material and the upper surface and the functional region of the optoelectronic chip. Therefore, no space is formed between the reflective material and the optoelectronic chip so that the adhesive layer can be continuously and totally distributed between the optical element and both of the reflective material and the optoelectronic chip, thereby enhancing the adhesion strength between the optical element and both of the reflective material and the optoelectronic chip.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF EMBODIMENTS

The present invention will now be described more specifically with reference to the following embodiments. It is to be noted that the following descriptions of the embodiments are presented herein for the purpose of illustration and description only. It is not intended to be exhaustive or to be limited to the precise form disclosed.

Figure 1:
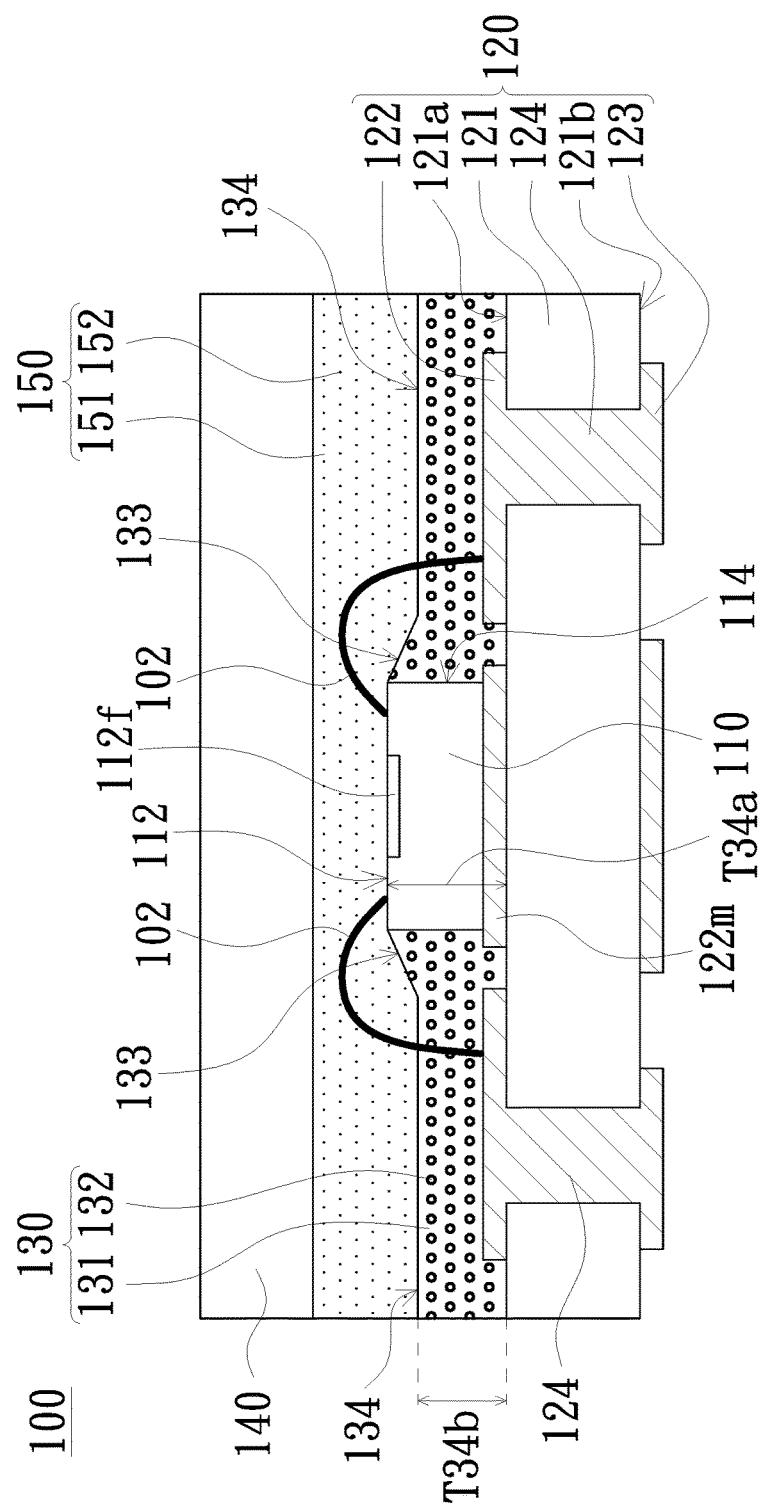
FIG. 1 is a schematic cross-sectional view of an optoelectronic package in accordance with an embodiment of the present invention.

FIG. 1 is a schematic cross-sectional view of an optoelectronic package in accordance with an embodiment of the present invention. Referring to FIG. 1, the optoelectronic package 100 includes an optoelectronic chip 110 and a wiring substrate 120. The optoelectronic chip 110 is mounted on the wiring substrate 120 and electrically connected to the wiring substrate 120. The wiring substrate 120 is a wiring board, which is, for example, a double-sided wiring board, a single-sided wiring board or a multilayer wiring board. Therefore, the wiring substrate 120 includes at least one metal pattern layer 122. Taking FIG. 1 as an example, the wiring substrate 120 is a double-sided wiring board.

The wiring substrate 120 has a holding plane 121a and a back side 121b, and includes two metal pattern layers 122 and 123. The holding plane 121a is opposite to the back side 121b, where the two metal pattern layers 122 and 123 are located on the holding plane 121a and the back side 121b, respectively. The wiring substrate 120 further includes an insulating layer 121 and at least one conductive pillar 124. The insulating layer 121 has the holding plane 121a and the back side 121b (with respect to surfaces thereof). Each of the conductive pillar 124 is formed in the insulating layer 121 and integrally connected to the metal pattern layers 122 and 123. Accordingly, the metal pattern layers 122 and 123 can be electrically connected to each other via the conductive pillars 124. In addition, it should be noted that the wiring substrate 120 shown in FIG. 1 is a double-sided wiring board. However, in other embodiment, the wiring substrate 120 may also be a single-sided wiring board or a multilayer wiring board. That is, the wiring substrate 120 shown in FIG. 1 is merely illustrative, and the wiring substrate 120 is not limited to a double-sided wiring board.

The optoelectronic chip 110 is mounted on the holding plane 121*a* and electrically-connected to the metal pattern layer 122, so that the optoelectronic chip 110 is electrically-connected to the wiring substrate 120. Taking FIG. 1 as an example, the optoelectronic chip 110 is mounted on the holding plane 121*a* in a wire-bonding manner. Specifically, the optoelectronic package 100 further includes at least one bonding wire 102 (two bonding wires 102 are illustrated in FIG. 1), and the bonding wires 102 electrically connect the optoelectronic chip 110 and the wiring substrate 120. The metal pattern layer 122 includes a plurality of traces and pads, and the bonding wires 102 connect the pads (not shown) of the metal pattern layer 122. Accordingly, the optoelectronic chip 110 can be electrically-connected to the metal pattern layer 122 by the bonding wire 102. In addition, it should be noted that in the embodiment of FIG. 1, the number of bonding wires 102 included in the optoelectronic package 100 is two. However, in other embodiments, the optoelectronic package 100 may include only one bonding wire 102. Therefore, the bonding wires 102 shown in FIG. 1 are merely an illustration, and the number of the bonding wires 102 in the optoelectronic package 100 is not limited to being two.

The optoelectronic chip 110 may be a packaged or an unpackaged die. In addition, the optoelectronic chip 110 may be a light emitting chip or a light sensing chip. The light emitting chip is, for example, an LED die, an LED package or a laser diode (LD) die. The light sensing chip is, for example, a charge-coupled device (CCD) or a complementary metal-oxide-semiconductor (CMOS) image sensor.

The optoelectronic chip 110 has an upper surface 112 and a functional region 112*f* formed in the upper surface 112. When the optoelectronic chip 110 is a light emitting chip, the functional region 112*f* is a light-emitting surface of the optoelectronic chip 110. That is, the optoelectronic chip 110 emits light from the functional region 112*f* after being powered on. When the optoelectronic chip 110 is a light sensing chip, the functional region 112*f* is a light-receiving surface of the optoelectronic chip 110. That is, the optoelectronic chip 110 can receive light from the functional region 112*f* and convert the light into an electrical signal. Since the functional region 112*f* is formed in the upper surface 112, the optoelectronic chip 110 can emit or receives light from its upper surface 112 whether the optoelectronic chip 110 is a light emitting chip or a light sensing chip.

The optoelectronic package 100 further includes a reflective material 130 disposed on the holding plane 121*a* and surrounding the optoelectronic chip 110. The reflective material 130 further covers part of the surface of the optoelectronic chip 110 and can touch the optoelectronic chip 110. In detail, the optoelectronic chip 110 has a side surface 114 connected and adjacent to the upper surface 112 thereof. The reflective material 130 covers the side surface 114 of the optoelectronic chip 110. That is, the reflective material 130 may touch the side surface 114 of the optoelectronic chip 110, and surround the optoelectronic chip 110. The reflective material 130 includes a polysiloxane 131 and a plurality of reflective particles 132. The reflective particles 132 are distributed in the polysiloxane 131, and the reflective particles 132 are, for example, metal particles. Therefore, the appearance of the reflective material 130 may exhibit metallic luster. In addition, the material of the reflective material 130 may be white polysiloxane, so the appearance color of the reflective material 130 may be white.

When the optoelectronic chip 110 is a light emitting chip, the reflective material 130 can reflect the light emitted by the optoelectronic chip 110 from the side (e.g., the boundary between the upper surface 112 and the side surface 114 of the optoelectronic chip 110), so that the optoelectronic package 100 can concentrate light as much as possible to emit the light from the upper surface 112 of the optoelectronic chip 110. In addition, when the optoelectronic chip 110 is a light sensing chip, the reflective material 130 can reflect light from the outside to the functional region 112*f* of the optoelectronic chip 110, so that the optoelectronic chip 110 can collect more light, thereby improving the light sensing capability of the optoelectronic chip 110.

The height of the reflective material 130 is not uniform. Taking FIG. 1 as an example, the height T34*a* of the reflective material 130 at the location where being adjacent to the optoelectronic chip 110 may be larger than that at other locations, e.g., larger than the height T34*b* of the reflective material 130 at the edge of the wiring substrate 120. The height (including heights T34*a* and T34*b*) herein is relative to the holding plane 121*a*, so the height T34*a* shown in FIG. 1 is equal to the thickness of the optoelectronic chip 110 plus the thickness of the metal pattern layer 122. The reflective material 130 has an inclined surface 133 surrounding the upper surface 112 of the optoelectronic chip 110 and extending from the edge of the upper surface 112 of the optoelectronic chip 110. The height T34*a* of the reflective material 130 at the inclined surface 133 decreases from the optoelectronic chip 110 toward the direction away from the optoelectronic chip 110. Therefore, in the range of the inclined surface 133, the height T34*a* of the reflective material 130 decreases from the optoelectronic chip 110 toward the wiring substrate 120, as shown in FIG. 1. The reflective material 130 further has a flat surface 134 extending from the inclined surface 133 and surrounding the inclined surface 133.

In the embodiment shown in FIG. 1, the metal pattern layer 122 may further include a mounting layer 122*m*. Both the optoelectronic chip 110 and the reflective material 130 are disposed on the mounting layer 122*m*, in which the optoelectronic chip 110 can be fixed to the mounting layer 122*m* by adhering, for example. In addition, the optoelectronic chip 110 may not be electrically-connected to the mounting layer 122*m*, so that there is no electrical current transmission between the mounting layer 122*m* and the optoelectronic chip 110. In other words, the optoelectronic chip 110 may be electrically-insulated from the mounting layer 122*m*. The mounting layer 122*m* protrudes from the side surface 114 of the optoelectronic chip 110, and the reflective material 130 can extend along the mounting layer 122*m*. The reflective material 130 is cured afterwards. Before being cured, the reflective material 130 is flowable. For example, the viscous coefficient of the reflective material 130 may be 18 poise.

The adhesive force between the reflective material 130 and a metal material is greater than the cohesion of the reflective material 130, so that the reflective material 130 can adhere to the metal pattern layer 122 and flow. Therefore, the metal pattern layer 122 can guide the flowing reflective material 130, and thus to control the distribution of the reflective material 130. In other words, the reflective material 130 can be formed via the metal pattern layer 122 without using a mold. Hence, after the optoelectronic chip 110 is fixed to the mounting layer 122m, the uncured reflective material 130 can flow on the partial mounting layer 122m protruding from the side surface 114 and further surround the optoelectronic chip 110.

Since the adhesive force between the reflective material 130 and the side surface 114 of the optoelectronic chip 110 is also greater than the cohesion of the reflective material 130 itself, the reflective material 130 can also easily adhere to the side surface 114 of the optoelectronic chip 110 and form an inclined surface 133. In the process of forming the reflective material 130, the amount of the reflective material 130 may be controlled so that the flowing reflective material 130 does not cover the upper surface 112 of the optoelectronic chip 110, thereby preventing the failure of the optoelectronic package 100 caused by the reflective material 130 shielding the functional region 112f. In addition, the inclined surface 133 is formed due to the adhesive force between the reflective material 130 and the side surface 114 of the optoelectronic chip 110, so the inclined surface 133 may actually be a curved surface.

The optoelectronic package 100 further includes an optical element 140 and an adhesive 150. The optical element 140 is a secondary optical element, which may be a lens or a transparent plate. Taking FIG. 1 as an example, the optical element 140 is a flat glass plate. The adhesive 150 covers the reflective material 130 and the upper surface 112 of the optoelectronic chip 110. The adhesive 150 binds or bonds the optoelectronic chip 110 with the optical element 140. In other words, the adhesive 150 is connected between the optoelectronic chip 110 and the optical element 140. In addition, the reflective material 130 and the adhesive 150 wrap around or encapsulate the bonding wires 102, as shown in FIG. 1.

The adhesive 150 may include a transparent medium 151 and a plurality of scattering particles 152. The scattering particles 152 may come from the diffusion powder and may scatter light, so that the appearance of the adhesive 150 is matte surface. When the optoelectronic chip 110 is a light emitting chip, the light emitted from the optoelectronic chip 110 and through the adhesive 150 is scattered by the scattering particles 152, so that the light can be emitted uniformly. In addition, the scattering particles 152 may come from fluorescent powder, and therefore, the adhesive 150 may also have a wavelength conversion function.

Figure 2:
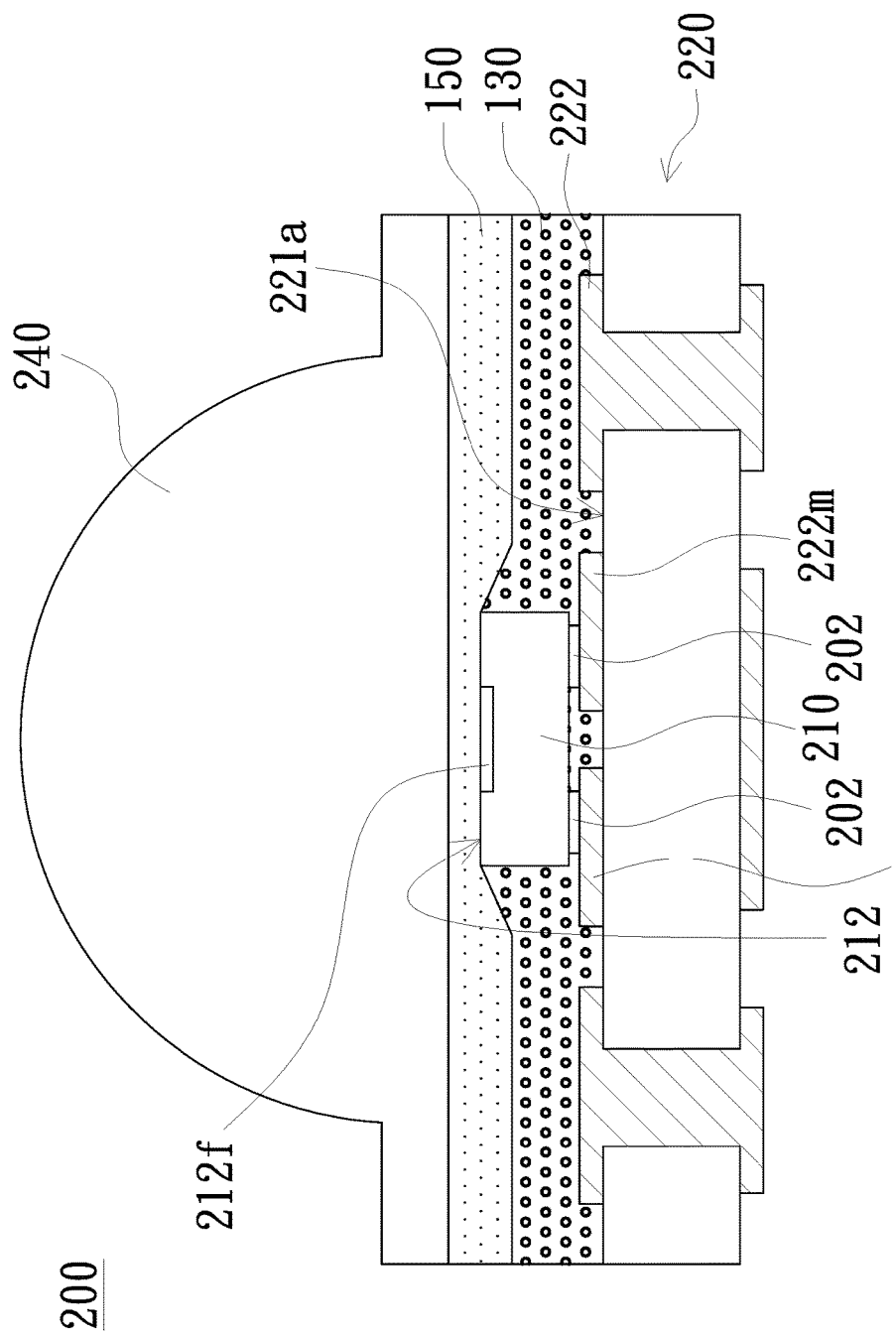
FIG. 2 is a schematic cross-sectional view of an optoelectronic package in accordance with another embodiment of the present invention.

FIG. 2 is a schematic cross-sectional view of an optoelectronic package in accordance with another embodiment of the present invention. Referring to FIG. 2, the optoelectronic package 200 of the present embodiment is similar to the optoelectronic package 100 of the previous embodiment, and both have the same function and also include many of the same components, such as the reflective material 130 and the adhesive 150. The wiring substrate 220 may be the same as the wiring substrate 120. The optoelectronic chip 210 may also be a light emitting chip or a light sensing chip, and has an upper surface 212 and a functional region 212f in the upper surface 212 thereof. The adhesive 150 also covers the upper surface 212 of the optoelectronic chip 210. The differences between the optoelectronic package 200 and the optoelectronic package 100 will be described below.

In the optoelectronic package 200 shown in FIG. 2, the optical element 240 is a lens, for example, a convex lens (as shown in FIG. 2), and the optoelectronic chip 210 is mounted on the holding plane 221a of the wiring substrate 220 in a flip-chip manner. Specifically, the optoelectronic package 200 includes a plurality of connection bumps 202, which may be solder balls. The connection bumps 202 connect the optoelectronic chip 210 and the wiring substrate 220, so that the optoelectronic chip 210 can be electrically-connected to the wiring substrate 220. In addition, the wiring substrate 220 includes a metal pattern layer 222, and the metal pattern layer 222 also includes a mounting layer 222m. However, different from the aforementioned optoelectronic package 100, the mounting layer 222m may be divided into at least two pads for connecting the optoelectronic chip 210, where the electrical current may be transmitted between the mounting layer 222m and the optoelectronic chip 210. Therefore, the mounting layer 222m can be electrically-connected to the optoelectronic chip 210.

In summary, the reflective material covers the side surface of the optoelectronic chip, and the adhesive that connects the optoelectronic chip and the optical element covers the upper surface of the reflective material and the optoelectronic chip and even covers the functional region. Therefore, compared with the existing optoelectronic package, no space is formed between the reflective material and the optoelectronic chip in the optoelectronic package according to at least one embodiment of the present invention, so that a frame-shaped and limited-size overlapping area is not formed between the both reflective material and the optoelectronic chip and the optical element. The adhesive layer can continuously and totally cover the reflective material and the optoelectronic chip, and is covered by the optical element. Therefore, the adhesion strength between both of the reflective material and the optoelectronic chip with respect to the optical element can be enhanced, respectively, and the reliability can be improved.

In addition, when the optoelectronic chip is a light emitting chip, the reflective material can reflect the light emitted from the optoelectronic chip so that the optoelectronic package can concentrate the light as much as possible to emit the light, thereby improving the brightness of the optoelectronic package. When the optoelectronic chip is a light sensing chip, the reflective material can reflect light from the outside to the functional region of the optoelectronic package to collect more light, thereby improving the light sensing capability of the optoelectronic chip.

While the invention has been described in terms of what is presently considered to be the most practical embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An optoelectronic package, comprising:
   a wiring substrate, having a holding plane;
   an optoelectronic chip, mounted on the holding plane of the wiring substrate and electrically-connected to the wiring substrate, wherein the optoelectronic chip has an upper surface, a functional region formed in the upper surface, and a side surface connected to the upper surface thereof;
   a reflective material, disposed on the holding plane of the wiring substrate and surrounding the optoelectronic chip, wherein the reflective material covers the side surface of the optoelectronic chip and has an inclined surface, the inclined surface surrounds the upper surface of the optoelectronic chip and extends from an edge of the upper surface, and a height of the reflective material at the inclined surface decreases from the optoelectronic chip toward a direction away from the optoelectronic chip;

an optical element; and an adhesive, covering the reflective material and the upper surface of the optoelectronic chip, and binding the optoelectronic chip with the optical element;

wherein the reflective material does not cover the upper surface of the optoelectronic chip.

2. The optoelectronic package according to claim 1, wherein the optoelectronic chip is a light emitting chip or a light sensing chip.

3. The optoelectronic package according to claim 1, wherein the wiring substrate comprises a metal pattern layer on the holding plane thereof, and the optoelectronic chip is electrically-connected to the metal pattern layer.

4. The optoelectronic package according to claim 3, wherein the metal pattern layer comprises a mounting layer, and both the optoelectronic chip and the reflective material are disposed on the mounting layer, wherein the mounting layer protrudes from the side surface of the optoelectronic chip, and the reflective material extends along the mounting layer.

5. The optoelectronic package according to claim 3, wherein the reflective material comprises a polysiloxane and a plurality of reflective particles.

6. The optoelectronic package according to claim 1, wherein the adhesive comprises a plurality of scattering particles.

7. The optoelectronic package according to claim 1, further comprising at least one bonding wire electrically-connecting the optoelectronic chip and the wiring substrate.

8. The optoelectronic package according to claim 7, wherein the reflective material and the adhesive encapsulate the at least one bonding wire.

9. The optoelectronic package according to claim 1, wherein the optoelectronic chip is mounted on the holding plane of the wiring substrate in a flip-chip manner.

10. The optoelectronic package according to claim 1, wherein the reflective material further has a flat surface extending from the inclined surface and surrounding the inclined surface thereof.

* * * * *